US008841205B2

(12) United States Patent
Kamimura et al.

(10) Patent No.: US 8,841,205 B2
(45) Date of Patent: Sep. 23, 2014

(54) MANUFACTURING METHOD AND APPARATUS FOR SEMICONDUCTOR DEVICE

(75) Inventors: Masaki Kamimura, Nagasaki-ken (JP); Takashi Shimizu, Oita-ken (JP); Kunihiro Miyazaki, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 422 days.

(21) Appl. No.: 13/217,736

(22) Filed: Aug. 25, 2011

(65) Prior Publication Data

US 2012/0052600 A1 Mar. 1, 2012

(30) Foreign Application Priority Data

Aug. 27, 2010 (JP) ................................ 2010-190948

(51) Int. Cl.
*H01L 21/20* (2006.01)
*H01L 21/36* (2006.01)
*H01L 21/31* (2006.01)
*G05B 19/418* (2006.01)
*H01L 21/66* (2006.01)

(52) U.S. Cl.
CPC ...... *H01L 22/20* (2013.01); *G05B 2219/32198* (2013.01); *G05B 19/41875* (2013.01); *G05B 2219/45031* (2013.01); *G05B 2219/32194* (2013.01)
USPC .... 438/479; 438/758; 438/778; 257/E21.001; 257/E21.206

(58) Field of Classification Search
None
See application file for complete search history.

(56) References Cited

U.S. PATENT DOCUMENTS

| 6,946,304 | B2 | 9/2005 | Shimizu et al. | |
| 7,195,930 | B2 | 3/2007 | Shimizu et al. | |
| 7,801,636 | B2 | 9/2010 | Lee et al. | |
| 2003/0164354 | A1* | 9/2003 | Hsieh et al. | 216/22 |
| 2007/0137567 | A1 | 6/2007 | Shimizu et al. | |
| 2007/0202614 | A1* | 8/2007 | Chiang et al. | 438/14 |
| 2008/0006650 | A1* | 1/2008 | Tseng et al. | 222/1 |
| 2008/0077269 | A1 | 3/2008 | Lee et al. | |

FOREIGN PATENT DOCUMENTS

| JP | 2005-332894 | 12/2005 |
| JP | 2008-77665 | 4/2008 |
| JP | 2009-076863 | 4/2009 |
| JP | 2010-073921 | 4/2010 |

OTHER PUBLICATIONS

Shishikura Isao, Seiko Epson Corp, Apr. 2, 2010, 1-31.*
Koukado Kenji, Sony Corp, Dec. 2, 2005, 1-12.*
Japanese Office Action for Japanese Application No. 2010-190948 mailed on Feb. 5, 2013.
Taiwanese Office Action issued on Feb. 20, 2014 in corresponding Taiwanese patent application No. 100129558, along with English translation.

* cited by examiner

*Primary Examiner* — Mohsen Ahmadi
(74) *Attorney, Agent, or Firm* — White & Case LLP

(57) ABSTRACT

A manufacturing method for a semiconductor device, comprising: performing first processing on a plurality of wafers in a first processing order in a first processing apparatus; obtaining a processed amount with respect to each of the plurality of wafers in the first processing; obtaining a processed amount with respect to each of the plurality of wafers by second processing in a second processing apparatus after the first processing; deciding a second processing order, which is different from the first processing order, from the processed amount with respect to each of the plurality of wafers by the first processing and the processed amount with respect to each of the plurality of wafers by the second processing; and performing the second processing on the plurality of wafers in the second processing order in the second processing apparatus.

10 Claims, 7 Drawing Sheets

MANUFACTURING METHOD AND APPARATUS FOR SEMICONDUCTOR DEVICE

CROSS-REFERENCE TO RELATED APPLICATION

This application is based upon and claims the benefit of priority from the prior Japanese Patent Application No. 2010-190948 filed on Aug. 27, 2010, the entire contents of which are incorporated herein by reference.

BACKGROUND

Embodiments described herein related generally to a manufacturing method and apparatus for a semiconductor device.

In a manufacturing process for a semiconductor device, variations occur in wafer machining. Examples thereof include variations in film thickness in a film formation step and variations in machining size such as an opening diameter in an etching step.

There has generally been used a technique of measuring a machining size or the like after machining, optimizing machining conditions based on the measured result and feeding the optimized conditions forward to a next step so as to suppress variations in machining.

DETAILED DESCRIPTION

Figure 1:
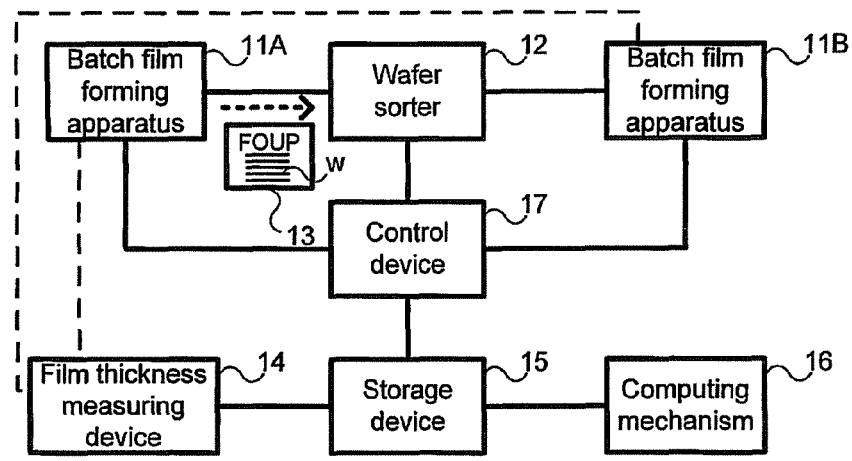
FIG. 1 is a diagram showing a configuration of a manufacturing apparatus for a semiconductor device according to an embodiment.

A manufacturing method for a semiconductor device according to an embodiment includes: performing first processing on a plurality of wafers in a first processing order in a first processing apparatus; obtaining a processed amount with respect to each of the plurality of wafers in the first processing; obtaining a processed amount with respect to each of the plurality of wafers by second processing in a second processing apparatus after the first processing; deciding a second processing order, which is different from the first processing order, from the processed amount with respect to each of the plurality of wafers by the first processing and the processed amount with respect to each of the plurality of wafers by the second processing; and performing the second processing on the plurality of wafers in the second processing order in the second processing apparatus.

Reference will now be made in detail to the present embodiment of the invention, an example of which is illustrated in the accompanying drawings. Wherever possible, the same reference numbers will be used throughout the drawing to refer to the same or like parts.

First Embodiment

FIG. 1 shows a configuration of a manufacturing apparatus for a semiconductor device according to a present embodiment. As shown in FIG. 1, for example, the manufacturing apparatus includes a batch film forming apparatus 11A as a first processing apparatus which arranges 25 wafers w constituting one lot respectively in predetermined processed positions (processing order), to perform first processing, a wafer sorter 12 as a processing order changing mechanism which sorts the wafers w after completion of the first processing, and a batch film forming apparatus 11B as a second processing apparatus which performs second processing on the plurality of wafers w in processed positions sorted by the wafer sorter 12.

In each of the batch film forming apparatuses 11A and 11B, wafers are placed, for example, on quartz boats (not shown) arranged in a vertical direction with predetermined intervals. The wafers w are transferred among the batch film forming apparatuses 11A and 11B, and wafer sorter 12, for example, via an FOUP (Front Open Unified Pod) 13 provided with slots that house the respective wafers w.

A film thickness measuring device 14 is provided which measures a film thickness as a machined amount in each of the batch film forming apparatuses 11A and 11B, configured to obtain a film thickness distribution. The film thickness measuring device 14 is connected with a storage device 15. The storage device 15 stores accumulated data on the film thickness distribution measured in the film thickness measuring device 14 in the past, film thickness data that is measured and updated, correlation data between the film thickness and a device characteristic (threshold voltage $V_{th}$, etc.), lot information on the wafers w to be processed, and the like. The lot information is made up of a wafer name, a product name, design information on a substrate to be produced, and the like, and stored in the form of database.

The storage device 15 is connected with a computing mechanism 16 that obtains a film thickness distribution as fluctuations in machined amount and a characteristic distribution based on the past accumulated data, the correlation data between the film thickness and the device characteristic, and the like. The data obtained by the computing mechanism 16 is stored into the storage device 15.

The storage device 15 is further connected with a control mechanism 17. In the control mechanism 17, optimal wafer processing conditions and processing order are obtained based on the data stored in the storage device 15. The optimal wafer processing conditions and processing order may also be obtained in the computing mechanism 16. The control device 17 controls the batch film forming apparatuses 11A and 11B, and the wafer sorter 12 which are connected to the control device 17, based on the obtained processing conditions and processing order.

Using the manufacturing apparatus for a semiconductor device with such a configuration, wafers in one lot are, for example, processed as in the following manner.

Figure 2:
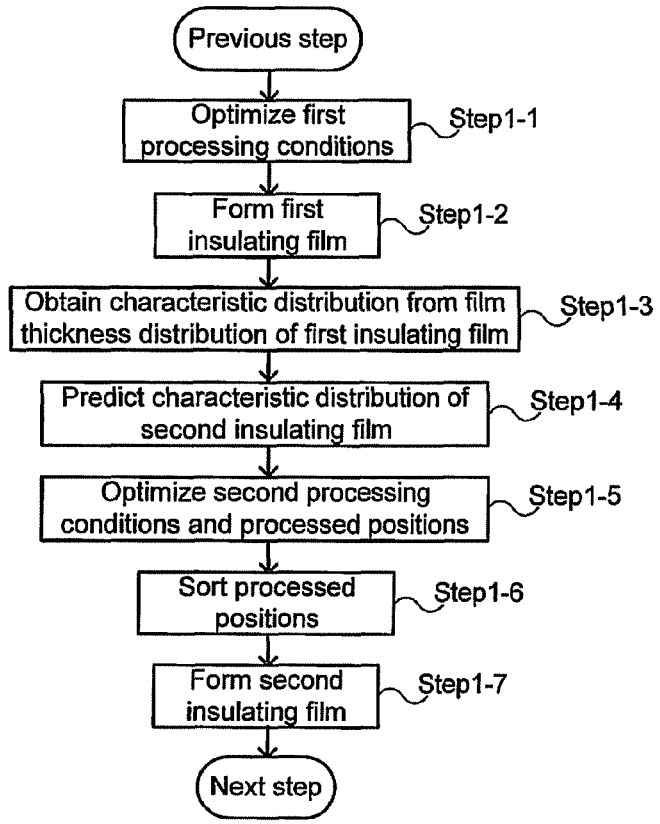
FIG. 2 is a flowchart showing a manufacturing process of a semiconductor device according to the embodiment.

FIG. 2 shows a flowchart. The wafers w in one lot machined in a previous step are arranged so as to be in the first processed positions, and introduced into the batch film forming apparatus 11A by means of the FOUP 13, while the processing conditions are optimized in the control mechanism 17 based on the lot information stored in the storage device 15 (Step 1-1). The 25 wafers in one lot are respectively provided, for example, with ID numbers of 1 to 25 sequentially from the bottom of the first processed positions.

On the optimized processing conditions, for example, a first insulating film such as a TEOS (Tetra EthOxy Silane) film to be a first gate side wall is formed on a wafer with a gate electrode formed thereon as the first processing (Step 1-2).

A film thickness of the first insulating film as a machined amount of each wafer in the processed lot is sequentially measured in the film thickness measuring device 14, and fluctuations in film thickness (film thickness distribution) inside the lot corresponding to the processed positions of the batch film forming apparatus 11A are obtained. The obtained film thickness distribution is transferred to the storage device 15 and stored into the storage device 15.

Figure 3A:
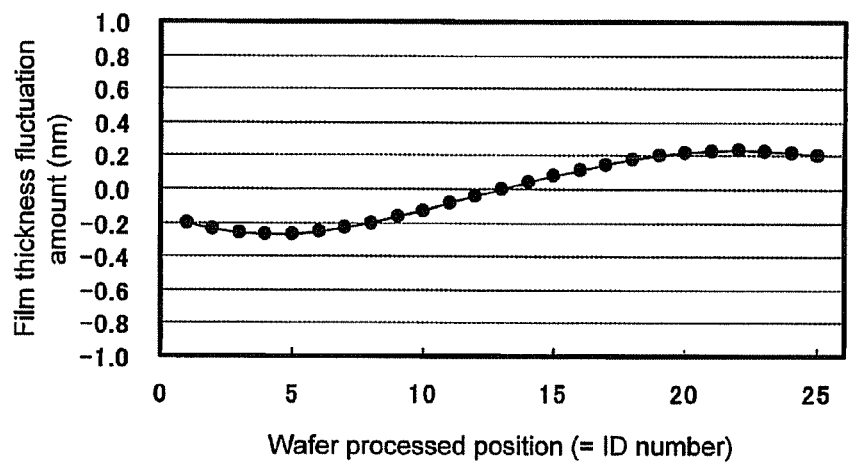
FIG. 3A is a diagram showing an example of a film thickness distribution according to the embodiment.

FIG. 3A shows an example of the film thickness distribution of the first insulating film. It is found that the film thickness fluctuates in accordance with the processed positions, as shown in FIG. 3A.

The film thickness distribution may be predicted from a past measured value in the computing mechanism 16 as in later-mentioned prediction of a characteristic distribution in the batch film forming apparatus 11B.

Figure 4:
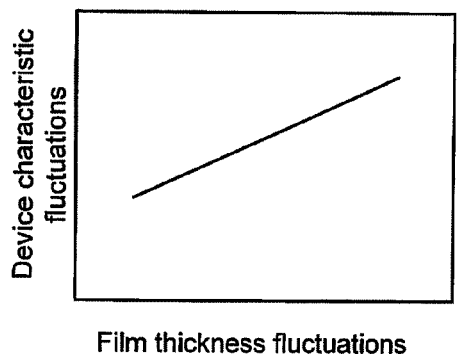
FIG. 4 is a diagram showing a correlation between a device characteristic and a film thickness according to the embodiment.

Correlation data between the obtained semiconductor device characteristic (device characteristic) and the first insulating film thickness, for example as shown in FIG. 4, has previously been stored into the storage device 15. From a film thickness distribution obtained based on this correlation data, fluctuations in device characteristic (characteristic distribution) corresponding to the processed positions are obtained in the computing mechanism 16 (Step 1-3).

Figure 3B:
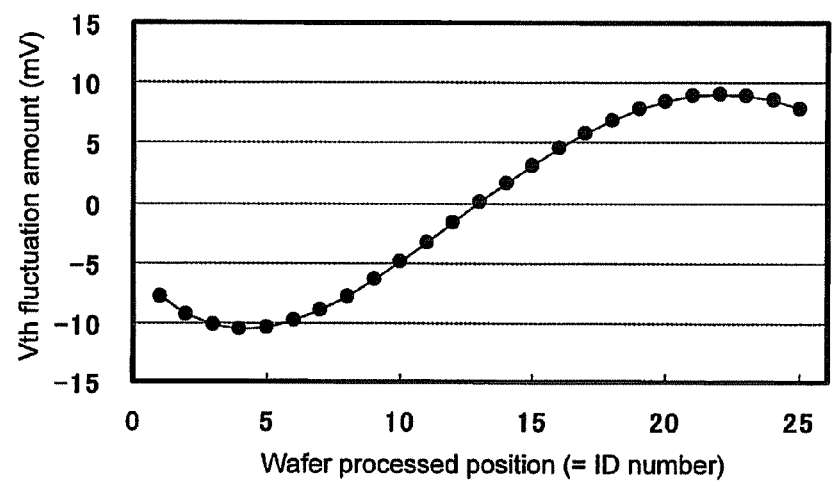
FIG. 3B is a diagram showing an example of a characteristic distribution according to the embodiment.

FIG. 3B shows an example of the characteristic distribution in a threshold voltage $V_{th}$ of an nMOS transistor as a typical characteristic. As shown in FIG. 3B, the distribution indicates a similar tendency to that of the film thickness distribution of the first insulating film shown in FIG. 3A.

For example, after processing such as etch back has been performed to form the first gate side wall, a second insulating film such as a SiN film to be a second gate side wall is formed in the batch film forming apparatus 11B as the second processing.

Figure 5A:
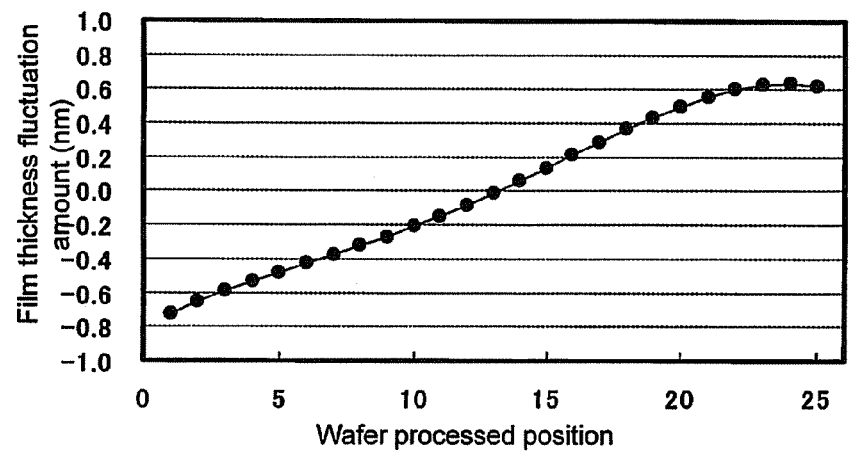
FIG. 5A is a diagram showing an example of a film thickness distribution according to the embodiment.
Figure 5B:
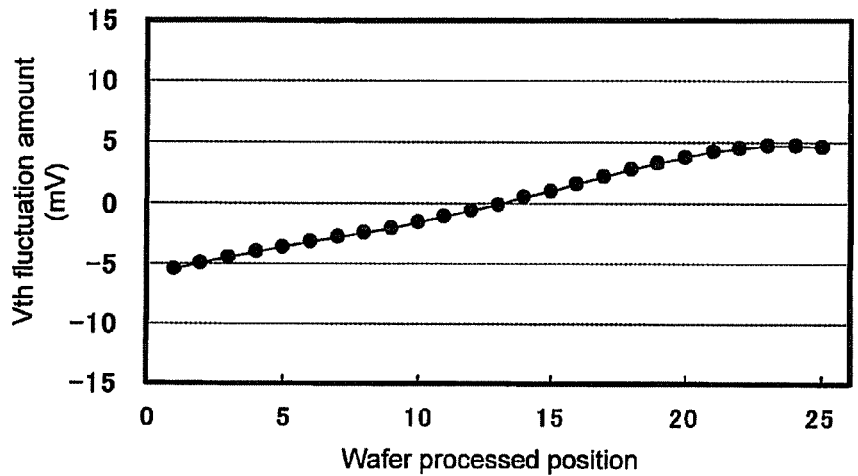
FIG. 5B is a diagram showing an example of a characteristic distribution according to the embodiment.

Also in the batch film forming apparatus 11B, the film thickness fluctuates in accordance with the processed positions as shown in FIG. 5A. As in the case of the first insulating film, a characteristic distribution is obtained based on correlation data between the threshold voltage $V_{th}$ of the nMOS transistor, as an obtained device characteristic and the second insulating film thickness, to result as in FIG. 5B.

Figure 6A:
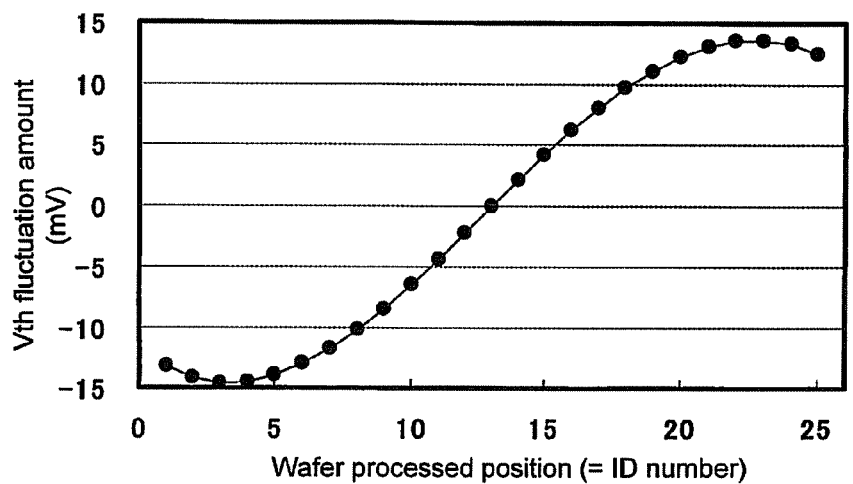
FIG. 6A is a diagram showing a conventional characteristic distribution.

FIG. 6A shows conventional fluctuations in $V_{th}$ (characteristic distribution) in combination of the first insulating film and the second insulating film as they are based on the above results. It is found that variations in $V_{th}$ are on the order of 30 mV. As thus described, the characteristic greatly fluctuates in accordance with the processed positions, thus increasing the variations.

In the present embodiment, the processing conditions are optimized in the control mechanism 17 based on the data in the storage device 15, while the processed positions in the batch film forming apparatus 11B are sorted, and the second processing is then performed.

In the control mechanism 17, for example as shown in Table 1, obtained fluctuation amounts $V_{th}$ (differences from an average value of $V_{th}$) in accordance with the processed positions in the batch film forming apparatus 11A are arranged in a descending order.

TABLE 1

| Vth fluctuation amount | Processed position | Wafer ID |
|---|---|---|
| 9.0 | 22 | 22 |
| 8.9 | 23 | 23 |
| 8.9 | 21 | 21 |
| 8.5 | 24 | 24 |
| 8.5 | 20 | 20 |
| 7.8 | 25 | 25 |
| 7.8 | 19 | 19 |
| 6.9 | 18 | 18 |
| 5.8 | 17 | 17 |
| 4.6 | 16 | 16 |
| 3.1 | 15 | 15 |
| 1.6 | 14 | 14 |
| 0.0 | 13 | 13 |
| −1.7 | 12 | 12 |
| −3.3 | 11 | 11 |
| −4.9 | 10 | 10 |
| −6.4 | 9 | 9 |
| −7.8 | 8 | 8 |
| −7.8 | 1 | 1 |
| −8.9 | 7 | 7 |
| −9.3 | 2 | 2 |
| −9.8 | 6 | 6 |
| −10.2 | 3 | 3 |
| −10.4 | 5 | 5 |
| −10.5 | 4 | 4 |

Based on the past processing data, the characteristic distribution obtained in the batch film forming apparatus 11B is predicted (Step 1-4).

In the batch film forming apparatus, although film thickness control by temperature control can be performed to a certain extent with respect to each zone, variations in concentration, temperature and the like of a film formation gas occur due to the hardware structure, whereby it is considered that the film thickness distribution (fluctuation amount, position dependency) does not greatly fluctuate so long as the processing conditions are fixed.

In reality, however, fluctuations in temperature and the like may occur with time due to aged deterioration in heater or the like, an accumulated amount of the film accumulated inside the apparatus, or the like, to result in fluctuations in film thickness distribution (fluctuation amount, position dependency). Thereat, it is preferable to measure the film thickness distribution with respect to each processed lot and update the date, so as to predict the characteristic distribution based on the latest data. Data on the closest processed lot may be taken as the predicted value, and further, an average of data on a plurality of lots or data predicted from a change of the lots can be taken as the predicted value, thereby to predict the characteristic distribution with higher accuracy.

As shown in Table 2, from the predicted characteristic distribution, fluctuation amounts of $V_{th}$ in accordance with the processed positions are arranged in an ascending order.

TABLE 2

| Vth fluctuation amount | Processed position |
| --- | --- |
| −5.5 | 1 |
| −4.9 | 2 |
| −4.4 | 3 |
| −4.0 | 4 |
| −3.6 | 5 |
| −3.2 | 6 |
| −2.8 | 7 |
| −2.4 | 8 |
| −2.0 | 9 |
| −1.6 | 10 |
| −1.1 | 11 |
| −0.6 | 12 |
| −0.1 | 13 |
| 0.5 | 14 |
| 1.0 | 15 |
| 1.6 | 16 |
| 2.2 | 17 |
| 2.7 | 18 |
| 3.3 | 19 |
| 3.8 | 20 |
| 4.2 | 21 |
| 4.5 | 22 |
| 4.6 | 25 |
| 4.7 | 23 |
| 4.8 | 24 |

Based on the obtained order of the fluctuation amounts, the processed positions in the batch film forming apparatus 11B are sorted such that a large one and a small one from the respective fluctuation amounts of $V_{th}$ are combined with each other as shown in Table 3.

TABLE 3

| Wafer ID | Processed position |
| --- | --- |
| 1 | 19 |
| 2 | 21 |
| 3 | 25 |
| 4 | 24 |
| 5 | 23 |
| 6 | 22 |
| 7 | 20 |
| 8 | 18 |
| 9 | 17 |
| 10 | 16 |
| 11 | 15 |
| 12 | 14 |
| 13 | 13 |
| 14 | 12 |
| 15 | 11 |
| 16 | 10 |
| 17 | 9 |
| 18 | 8 |
| 19 | 7 |
| 20 | 5 |
| 21 | 3 |
| 22 | 1 |
| 23 | 2 |
| 24 | 4 |
| 25 | 6 |

In this manner, the processed positions in the batch film forming apparatus 11B are optimized in the control mechanism 17 such that, from the characteristic distribution in the batch film forming apparatus 11A and the predicted characteristic distribution in the batch film forming apparatus 11B, fluctuations in these distributions are offset, to minimize the variations in characteristic (Step 1-5).

The wafers inside the lot are sorted by freely changing the slot positions inside the FOUP 13 in the wafer sorter 12, so as to be in the optimized processed positions (Step 1-6).

Figure 6B:
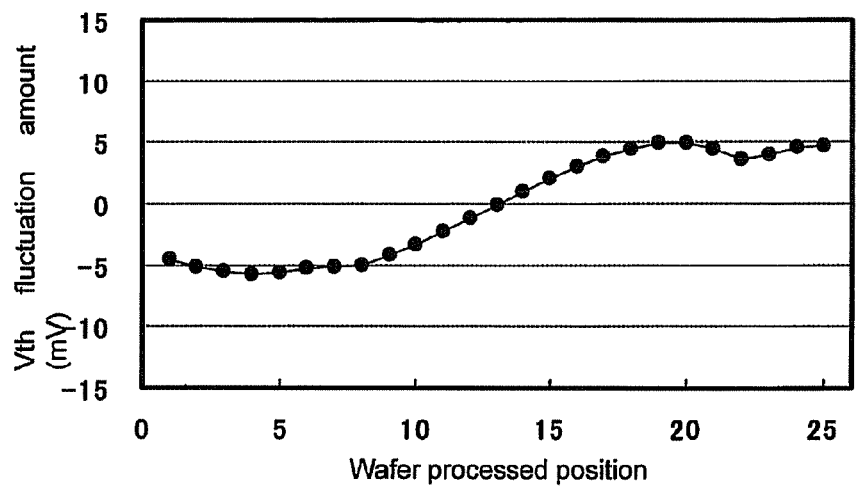
FIG. 6B is a diagram showing an example of a characteristic distribution according to the embodiment.

In the batch film forming apparatus 11B, the second insulating film is formed in accordance with the optimized processing conditions and processed positions (Step 1-7). Herein, FIG. 6B shows fluctuations in (characteristic distribution of) $V_{th}$ in combination of the first insulating film and the second insulating film. It is found that the variations in $V_{th}$ are on the order of 10 mV, and can thus be on the order of a third of the conventional one.

According to the present embodiment, the processing order in the latter step out of two steps is optimized so as to offset variations in characteristic obtained in machining by the two steps, whereby it is possible to suppress variations in characteristic, and thus improve a manufacturing yield.

Second Embodiment

The present embodiment is similar to the first embodiment in terms of the configuration of the manufacturing apparatus for a semiconductor device, but is different therefrom in that the first processing apparatus is a single-wafer film forming apparatus.

Figure 7:
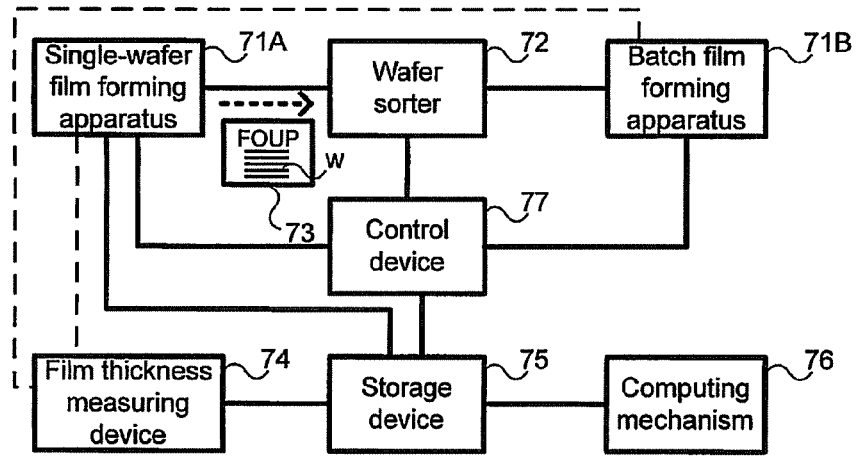
FIG. 7 is a diagram showing a configuration of a manufacturing apparatus for a semiconductor device according to an embodiment.

FIG. 7 shows a configuration of a manufacturing apparatus for a semiconductor device in the present embodiment. As shown in FIG. 7, for example, the manufacturing apparatus includes a single-wafer film forming apparatus 71A as a first processing apparatus which performs first processing on 25 wafers w constituting one lot respectively in a predetermined processing sequence (processing order), a wafer sorter 72 as a processing order changing mechanism which sorts the wafers w, as in the first embodiment, after completion of the first processing, and a batch film forming apparatus 7113 as a second processing apparatus which performs second processing on the plurality of wafers w in processed positions sorted by the wafer sorter 72.

As in the first embodiment, the wafers w are transferred among the single-wafer film forming apparatus 71A, the batch film forming apparatus 71B and wafer sorter 72, for example, via an FOUP 73 provided with slots that house the respective wafers w.

A film thickness measuring apparatus 74 is provided which measures a film thickness as a machined amount in each of the single-wafer film forming apparatus 71A and the batch film forming apparatus 71B, to obtain a film thickness distribution. The film thickness measuring device 74 is connected with a storage device 75.

As in the first embodiment, the storage device 75 stores accumulated data on the film thickness distribution measured in the film thickness measuring device 74 in the past, film thickness data to be measured, correlation data between the film thickness and a device characteristic (threshold voltage $V_{th}$, etc.), lot information on the wafers w to be processed, and the like. The lot information is made up of a wafer name, a product name, design information on a substrate to be produced, and the like, and stored in the form of database. Further, it is connected, as needed, to the single-wafer film forming apparatus 71A to store data on standby time and correlation data between the standby time and the film thickness distribution of the single-wafer film forming apparatus 71A.

As in the first embodiment, the storage device 75 is connected with a computing mechanism 76 that obtains a film thickness distribution as fluctuations in machined amount and a characteristic distribution based on the past accumulated data, the correlation data between the film thickness and the device characteristic, and the like. The data obtained by the computing mechanism 76 is stored into the storage device 75.

The storage device 75 is further connected with the control mechanism 77. In the control mechanism 77, optimal wafer processing conditions and processing order can be obtained based on the data stored in the storage device 75. The control mechanism 77 is further connected with the single-wafer film forming apparatus 71A, the batch film forming apparatus 71B and the wafer sorter 72, and controls the single-wafer film forming apparatus 71A, the batch film forming apparatus 71B and the wafer sorter 72 based on the obtained processing conditions and processing order.

Using the manufacturing apparatus for a semiconductor device with such a configuration, wafers in one lot are, for example, processed as in the following manner.

Figure 8:
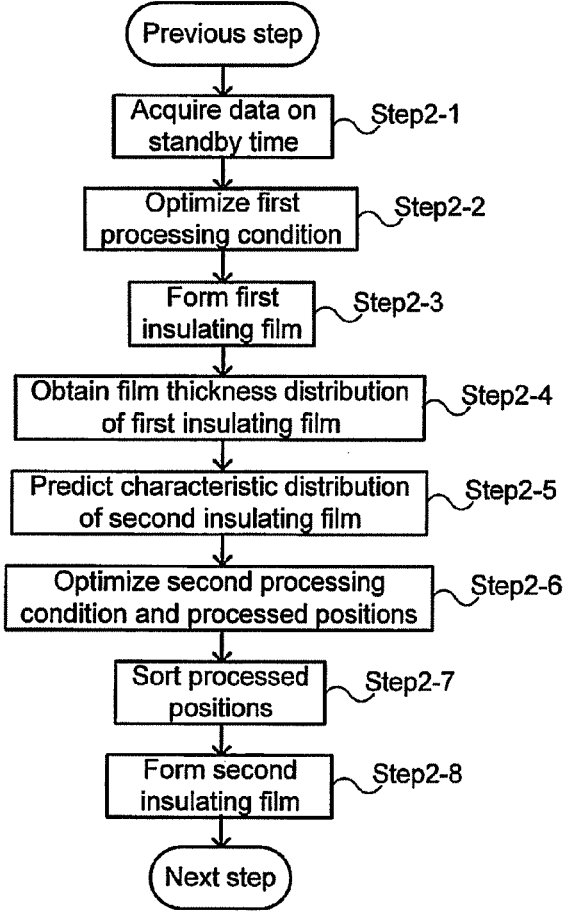
FIG. 8 is a flowchart showing a manufacturing process of a semiconductor device according to the embodiment.

FIG. 8 shows a flowchart. The wafers w in one lot machined in a previous step are loaded into the single-wafer film forming apparatus 71A by means of a FOUP 73 in the first processing sequence. Data on standby time is acquired by the single-wafer film forming apparatus 71A (Step 2-1), which is then transferred to the storage device 75 and stored into the storage device 75. In the control mechanism 77, processing conditions are optimized based on the lot information stored in the storage device 75 (Step 2-2). The 25 wafers in one lot are respectively provided with, for example, ID numbers of 1 to 25 in the first processing sequence.

On the optimized processing conditions, as in the first embodiment, for example, a first insulating film such as a TEOS film to be a first gate side wall is formed on a wafer with a gate electrode formed thereon as the first processing (Step 2-3). In this manner, the wafers w are sequentially processed in a predetermined processing sequence in the single-wafer film forming apparatus 71A.

The film thickness of the first insulating film as a machined amount of each wafer in the processed lot is sequentially measured in the film thickness measuring device 74, and fluctuations in film thickness (film thickness distribution) inside the lot corresponding to the processing sequence of the batch film forming apparatus 71A are acquired (Step 2-4). The obtained film thickness distribution is transferred to the storage device 75 and stored into the storage device 75.

Figure 9A:
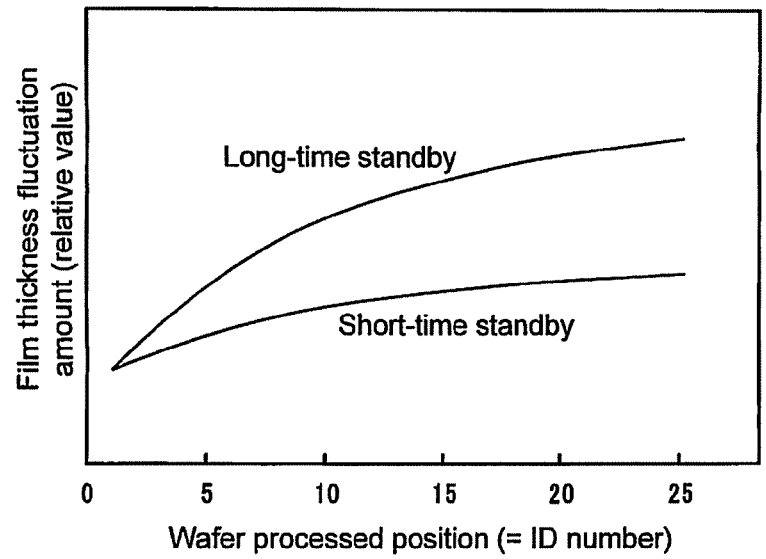
FIGS. 9A to 9C are diagrams each showing a film thickness distribution according to the embodiment.

FIG. 9A shows an example of the film thickness distribution of the first insulating film. FIG. 9A shows a case where the time after processing on one wafer until processing on a next wafer by the single-wafer film forming apparatus 71A (hereinafter referred to as standby time) is long (e.g. about one hour), along with the case of the standby time being short (e.g. about three seconds) due to successive processing or the like, and following FIGS. 9B to 9E also show those cases. As shown in FIG. 9A, it is found that the film thickness distribution fluctuates in accordance with the standby time of the single-wafer film forming apparatus 71A. The one with the short standby time has small variations in film thickness in accordance with the processing sequence, and the one with long standby time has large variations in film thickness in accordance with the processing sequence.

As thus described, the film thickness distribution varies in accordance with the standby time of the single-wafer film forming apparatus 71A. This significantly appears on a first wafer in a processed lot as characteristic fluctuations, and the tendency of the fluctuations is specific to each device. Therefore, it is also possible to previously store correlation data between the standby time and the film thickness distribution into the storage device 75, and predict the film thickness distribution from the standby time data based on the correlation data.

For example, processing such as etchback is performed to form the first gate side wall, and thereafter, a second insulating film such as a SiN film to be a second gate side wall is formed in the batch film forming apparatus 71B as the second processing.

Figure 9B:
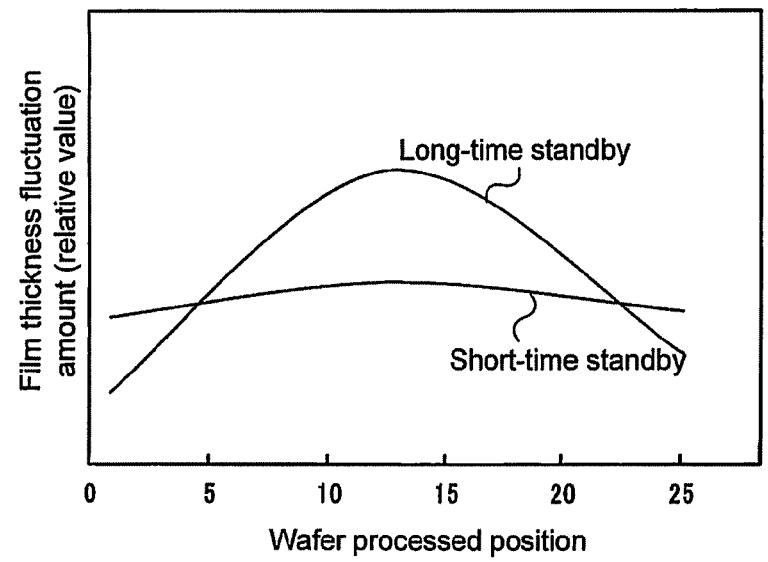

As in the first embodiment, a film thickness distribution in accordance with the processing positions of the second insulating film formed by the batch film forming apparatus 71B is predicted in the computing mechanism 76 (Step 2-5). For example, as shown in FIG. 9B, the processed positions in the batch film forming apparatus 71B are optimized in the control mechanism 77 in the first embodiment such that fluctuations in film thicknesses of the first insulating film and the second insulating film are offset, to minimize the variations (Step 2-6). A processing temperature, processing time and the like at the time of changing the processed positions and forming the second insulating film may be simultaneously controlled, to perform the optimization.

As in the first embodiment, the wafers inside the lot are sorted by freely changing the slot positions inside the FOUP 73 in the wafer sorter 72, so as to be in the optimized processed positions (Step 2-7).

Figure 9C:
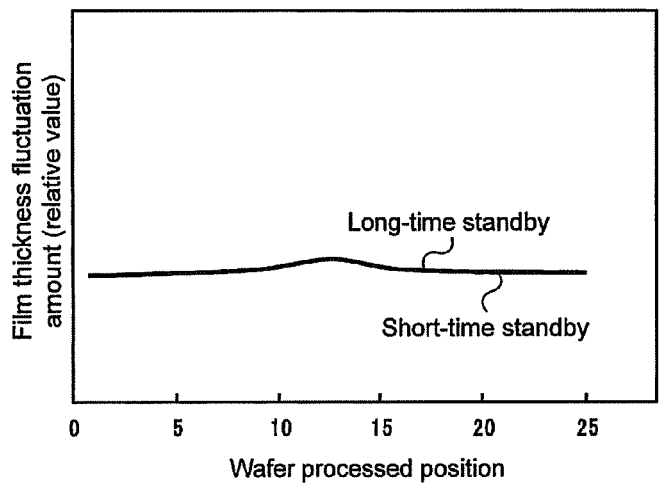
Figure 9D:
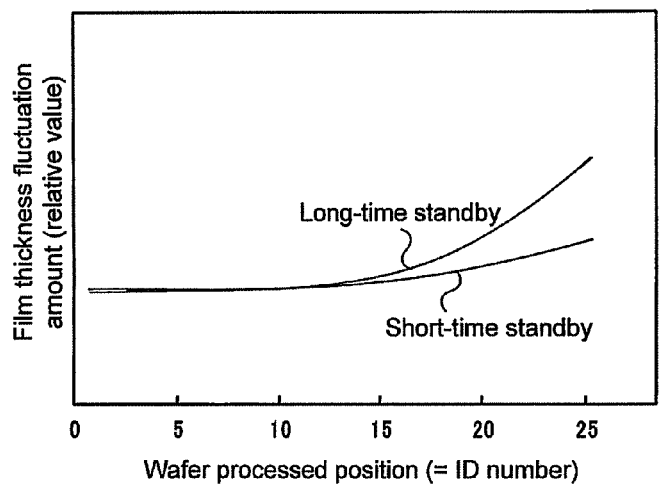
FIG. 9D is a diagram showing a film thickness distribution according to a comparative example.

In the batch film forming apparatus 71B, the second insulating film is formed in accordance with the optimized processing conditions and processed positions (Step 2-8). FIG. 9C shows fluctuations in laminated film thickness of the first insulating film and the second insulating film (laminated film thickness distribution). It is found that as compared with a case shown in FIG. 9D where the sorting is not performed, variations in laminated film thickness distribution are suppressed. Since the laminated film thickness has a correlation with the obtained electric characteristic such as $V_{th}$ in the semiconductor device, the variations in characteristic can be suppressed by suppression of the variations in laminated film thickness distribution.

Although the single-wafer film forming apparatus and the batch film forming apparatus are combined in the present embodiment, a similar effect can be obtained even by combination of the single-wafer film forming apparatuses. In this case, the processing sequence is sorted in place of the processed positions of wafers inside a lot.

According to the present embodiment, the processing order in the latter step out of two steps is optimized so as to offset variations in machined amount as an amount machined by the two steps, whereby it is possible to suppress variations in characteristic which causes the variations in machined amount, and thus improve a manufacturing yield.

Although $V_{th}$ has been cited as the obtained characteristic of the semiconductor device and the value has been used which is obtained from the correlation with the film thickness measured by the film thickness measuring device in these embodiments, a value measured by a prober that measures an electric characteristic with respect to each chip inside the wafer may also be used. Further, in addition to $V_{th}$, another electric characteristic such as an on-current $I_{on}$, a figuration characteristic such as a wiring width, a width of the gate electrode, a width of the gate side wall, or the like can also be employed.

For example, as for $I_{on}$, a value obtained from the correlation with the film thickness as with $V_{th}$ or a value measured by the prober as a characteristic measuring device can be used. Further, as for the figuration characteristic such as the wiring width, the width of the gate electrode or the width of the gate side wall, a value measured, for example, by a CD-SEM (Current Density Scanning Electron Microscope), a scatterometry or the like can be used. Any one or more of these characteristic measuring devices may be provided.

Although the film formation step has been described as the example in these embodiments, the embodiments can also be applicable to other processing steps such as a lithography step, an etching step and an ion implantation step. Further, although the machined amounts or the variations in characteristic in the two steps in the film formation step have been offset in these embodiments, for example, machined amounts or variations in characteristic in different steps, such as the film formation step and the lithography step, can also be offset so long as each of these steps has an effect on the same characteristic of the semiconductor device and is a step where variations occur in accordance with the processing order.

Although the machined amounts or the variations in characteristic in the two steps have been offset in these embodiments, the number of steps may be two or larger, and machined amounts or variations in characteristic in three or four steps, such as a formation step for a gate side wall made up of three or more layers may be offset. Moreover, a single process such as film formation, etching and the like can be divided into two or more steps, and the wafers w can be sorted between those steps, to offset machined amounts or variations in characteristic in the single process.

While certain embodiments have been described, these embodiments have been presented by way of example only, and are not intended to limit the scope of the inventions. Indeed, the novel embodiments described herein may be embodied in a variety of other forms; furthermore, various omission, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method for a semiconductor device, comprising:
   performing a first processing on a plurality of wafers in a first processing order in a first processing apparatus;
   obtaining a first characteristic with respect to the first processing of the plurality of wafers;
   obtaining a second characteristic with respect to a second processing of an other plurality of wafers in a second processing apparatus after the first processing, the second characteristic being obtained by updating a past measured value of the second characteristic with respect to the second processing in the second processing apparatus in the past to a latest measured value of the second characteristic, and predicting a characteristic distribution which is formed by characteristic of each of semiconductor devices which is formed on the other plurality of wafers based on the latest measured value; and
   determining a second processing order, which is different from the first processing order, for wafers to be processed by the second processing apparatus based on the first characteristic and the second characteristic.

2. The manufacturing method for a semiconductor device according to claim 1, wherein the second processing order is determined so as to minimize variations in the characteristics of the semiconductor devices.

3. The manufacturing method for a semiconductor device according to claim 1, wherein
   the plurality of wafers constitute one lot,
   the measured value of the second characteristic is a measured value of a second characteristic which the other plurality of wafers have, the other plurality of wafers constituting at least one other lots which are different from the one lot, and
   the updating the past measured value of the second characteristic with respect to the second processing in the second processing apparatus in the past to the latest measured value of the second characteristic is performed with respect to each lots.

4. The manufacturing method for a semiconductor device according to claim 3, wherein
   the latest measured value is one of the measured value of the second characteristic which the other plurality of wafers have, the other plurality of wafers constituting the one other lot immediately before the one lot,
   an average value of the measured values of the second characteristics which the other plurality of wafers have, the other plurality of wafers constituting the other plurality of lots each of which is different from the one lot, each of the second characteristics being obtained from each of the other plurality of lots, and
   a value predicted from a change of the measured values of the second characteristics which the other plurality of wafers have, the other plurality of wafers constituting the other plurality of lots each of which is different from the one lot, each of the second characteristics being obtained from each of the other plurality of lots.

5. The manufacturing method for a semiconductor device according to claim 3, wherein the second processing order is determined by each lots.

6. The manufacturing method for a semiconductor device according to claim 1, wherein the update of the measured value is performed with respect to each wafers.

7. A manufacturing apparatus for a semiconductor device, comprising:
   a first processing apparatus configured to perform a first processing on a plurality of wafers in a first processing order;
   a second processing apparatus configured to perform a second processing on the plurality of wafers in a second processing order after the first processing;
   a first mechanism which obtains a first characteristic with respect to the first processing of the plurality of wafers;
   a second mechanism configured to obtain a second characteristic with respect to the second processing of an other plurality of wafers, the second characteristic being obtained by updating a past measured value of the second characteristic with respect to the second processing in the second processing apparatus in the past to a latest measured value of the second characteristic, and predicting a characteristic distribution which is formed by characteristic of each of the semiconductor devices which is formed on the other plurality of wafers based on the latest measured value;
   a third mechanism configured to determine the second processing order for wafers to be processed by the second processing apparatus based on the first characteristic and the second characteristic;
   a fourth mechanism configured to change the plurality of wafers from the first processing order to the second processing order; and
   a fifth mechanism configured to control the first processing apparatuses, the second processing apparatuses, the first mechanism, the second mechanism, the third mechanism, and the fourth mechanism.

8. The manufacturing apparatus for a semiconductor device according to claim 7, wherein the third mechanism determines the second processing order such that variations in the characteristics of the semiconductor devices are minimized.

9. The manufacturing apparatus for a semiconductor device according to claim 7,
   wherein the plurality of wafers constitute one lot,
   the measured value of the second characteristic is a measured value of a second characteristic which the other plurality of wafers have, the other plurality of wafers constituting at least one other lots which are different from the one lot, and the updating the past measured value of the second characteristic with respect to the second processing in the second processing apparatus in the past to the latest measured value of the second characteristic is performed with respect to each lots.

10. The manufacturing apparatus for a semiconductor device according to claim 9, wherein the latest measured value is one of the measured value of the second characteristic which the other plurality of wafers have, the other plurality of wafers constituting the one other lot immediately before the one lot, an average value of the measured values of the second characteristics which the other plurality of wafers have, the other plurality of wafers constituting the other plurality of lots each of which is different from the one lot, each of the second characteristics being obtained from each of the other plurality of lots, and a value predicted from a change of the measured values of the second characteristics which the other plurality of wafers have, the other plurality of wafers constituting the other plurality of lots each of which is different from the one lot, each of the second characteristics being obtained from each of the other plurality of lots.

* * * * *